(12) United States Patent
Suzuki (10) Patent No.: US 7,832,588 B2
(45) Date of Patent: Nov. 16, 2010

(54) CASE STRUCTURE FOR ELECTRONIC DEVICE

(75) Inventor: Tatsuya Suzuki, Tokyo (JP)

(73) Assignee: Olympus Corporation, Tokyo (JP)

( * ) Notice: Subject to any disclaimer, the term of this patent is extended or adjusted under 35 U.S.C. 154(b) by 212 days.

(21) Appl. No.: 11/231,718

(22) Filed: Sep. 20, 2005

(65) Prior Publication Data
US 2006/0010803 A1    Jan. 19, 2006

Related U.S. Application Data

(63) Continuation of application No. PCT/JP2005/004710, filed on Mar. 10, 2005.

(30) Foreign Application Priority Data

May 7, 2004    (JP)    ............ P2004-138248

(51) Int. Cl.
*B65D 25/22*    (2006.01)
(52) U.S. Cl. .......... 220/475; 312/9.45; 312/265.6; 312/305; 220/531
(58) Field of Classification Search ............ 52/783.12, 52/783.1; 312/265.4, 223.3, 265.5, 304, 312/223.2, 187, 9.45, 265.6, 351.7, 305; 439/610; 220/3.9, 4.02, 4.23, 475, 531
See application file for complete search history.

(56) References Cited

U.S. PATENT DOCUMENTS

| | | | | |
|---|---|---|---|---|
| 3,567,563 A | * | 3/1971 | Haudenchild | ............ 428/49 |
| 3,948,579 A | * | 4/1976 | Schirmer | ............ 312/111 |
| 4,090,632 A | * | 5/1978 | Katzmann et al. | ............ 220/4.01 |
| 4,270,820 A | * | 6/1981 | McMullan et al. | ............ 312/242 |
| 4,343,907 A | * | 8/1982 | Graefe | ............ 435/290.1 |
| 4,882,600 A | | 11/1989 | Van de Moere | |
| 4,915,251 A | * | 4/1990 | Payne | ............ 220/4.23 |
| 5,034,033 A | * | 7/1991 | Alsup et al. | ............ 96/58 |
| 5,560,483 A | * | 10/1996 | Sequin | ............ 206/278 |
| 5,708,901 A | | 1/1998 | Manabe | |
| 5,832,692 A | * | 11/1998 | Opferbeck et al. | ............ 52/745.19 |
| 6,036,290 A | | 3/2000 | Jancsek et al. | |
| 6,405,509 B1 | * | 6/2002 | Razl | ............ 52/800.12 |
| 6,446,809 B2 | * | 9/2002 | Flynn | ............ 206/523 |
| 6,636,697 B2 | * | 10/2003 | Smith et al. | ............ 396/26 |
| 6,856,766 B2 | * | 2/2005 | Suzuki | ............ 396/535 |

(Continued)

FOREIGN PATENT DOCUMENTS

DE    3421655    6/1984

(Continued)

OTHER PUBLICATIONS

Japanese language office action and its English translation for corresponding Japanese application No. 2004-138248 lists the references above.

(Continued)

*Primary Examiner*—Richard E Chilcot, Jr.
*Assistant Examiner*—Chi Q Nguyen
(74) *Attorney, Agent, or Firm*—Hogan Lovells US LLP (57) ABSTRACT

The invention is directed to a case structure for an electronic device. The case structure comprises at least two covering members made of a wooden material for covering a covered member; and a supporting member provided along the inner surfaces of the covering members for supporting the covering members.

8 Claims, 5 Drawing Sheets

U.S. PATENT DOCUMENTS

| | | | | |
|---|---|---|---|---|
| 7,048,474 B2 * | 5/2006 | Tabler | ............... | 405/302.7 |
| 2004/0022036 A1 | 2/2004 | Suzuki | | |
| 2005/0287316 A1 * | 12/2005 | Croce | ............... | 428/34.1 |
| 2005/0287868 A1 * | 12/2005 | Suzuki | ............... | 439/610 |
| 2008/0156916 A1 * | 7/2008 | DeLuca et al. | ............... | 242/171 |
| 2008/0242780 A1 * | 10/2008 | Dower | ............... | 524/275 |

FOREIGN PATENT DOCUMENTS

| | | |
|---|---|---|
| EP | 0 791 850 | 8/1997 |
| JP | 63184395 A | 7/1988 |
| JP | 03104193 A | 5/1991 |
| JP | 670292 U | 9/1994 |
| JP | 07095104 A | 4/1995 |
| JP | 09191190 A | 7/1997 |
| JP | 09270586 A | 10/1997 |
| JP | 09321452 A | 12/1997 |
| JP | 10243139 A | 9/1998 |
| JP | 10304034 A | 11/1998 |
| JP | 3057997 U | 3/1999 |
| JP | 11274747 A | 10/1999 |
| JP | 11312870 A | 11/1999 |
| JP | 2000323858 A | 11/2000 |
| JP | 2003101250 A | 4/2003 |
| JP | 2003111415 A | 4/2003 |
| JP | 2003258446 A | 9/2003 |
| JP | 2003283150 A | 10/2003 |
| JP | 2004023868 A | 1/2004 |
| JP | 2004-064021 | 2/2004 |
| WO | 03/021921 | 3/2003 |

OTHER PUBLICATIONS

Japanese language office action and its English translation for corresponding Japanese patent application No. 2004-138248 lists the reference above.

* cited by examiner

CASE STRUCTURE FOR ELECTRONIC DEVICE

PRIORITY CLAIM

The present application is a continuation of International Application No. PCT/JP2005/004710, filed Mar. 10, 2005, whose priority is claimed on Japanese Patent Application No. 2004-138248, filed May 7, 2004. The contents of both International Application and the Japanese Patent Application are incorporated herein by reference.

TECHNICAL FIELD

This invention relates to a case structure for an electronic device. For example, this invention relates to a case structure that is appropriate for an electronic device such as a camera, a portable telephone, and an IC recorder, or an electronic device such as a remote control for consumer electronic products such as a television set, a video recorder, an air conditioner, and a projector.

BACKGROUND ART

A covering member for an electronic device such as a camera, a portable telephone, and an IC recorder, or an electronic device such as a remote control for consumer electronic products such as a television set, a video recorder, an air conditioner, and a projector constitutes a casing that contains built-in electronic parts or optical parts, and contributes to the design for outer appearance of these devices.

Conventionally, these covering members are made up of a relatively thin plate member, a shell member, or the like, as for the shape in order to reduce the size and the weight of the devices, and are generally produced of the materials such as synthetic resin or light metal, which are suitable for mass production.

On the other hand, materials such as synthetic resin or light metal have a disadvantage in that they are difficult to hold comfortably in the hand, due to lack of hygroscopicity. Accordingly, a proposal has been made that as a covering material, natural materials such as wood or bamboo be used which tend to be comfortable in the hand and are endowed with excellent hygroscopicity and delicate features which provide good sensation.

Japanese Unexamined Patent Publication No. 2004-64021 (pages 2-4, and FIG. 1) discloses a component material for constructing a casing for electronic devices which is formed of a wooden material, and whose surface is carbonized. The Publication also discloses a camera covered by a front cover and a rear cover using a wooden material, both being a thin shell type, where a circuit unit and an imaging unit are attached to a chassis. The front cover and the rear cover are connected together and secured to the chassis.

DISCLOSURE OF INVENTION

One aspect of the invention relates to a case structure for an electronic device. The case structure comprises at least two covering members made of a wooden material for covering a covered member; and a supporting member provided along the inner surfaces of the covering members for supporting the covering members.

Advantageously, the supporting member includes a frame structure.

Advantageously, the supporting member includes a net-like frame structure.

Preferably, the supporting member is also a holding member for holding the covered member.

Preferably, the supporting member is also a holding member for holding an external member provided outside the covering member.

Preferably, the supporting member has a frame-shaped securing member for securing the end portion of the covering member.

BEST MODE FOR CARRYING OUT THE INVENTION

Embodiments in accordance with the invention will be described with reference to the figures. In all the figures, even if the embodiments are different, the same reference numerals are applied to similar or equivalent elements, and explanations which are the same in the embodiments are omitted.

Figure 1:
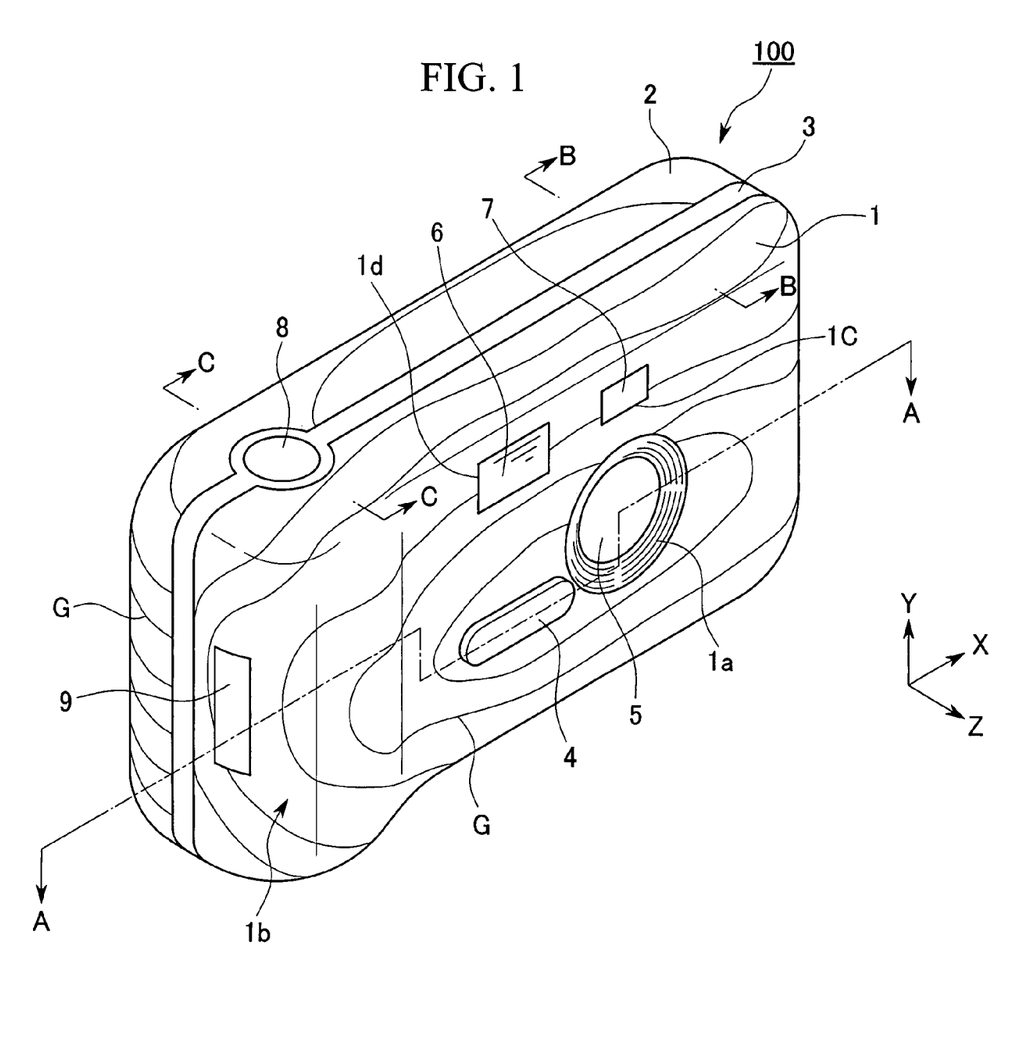
FIG. 1 is a perspective view of a digital camera that uses the case structure according to an embodiment of the invention.
Figure 2:
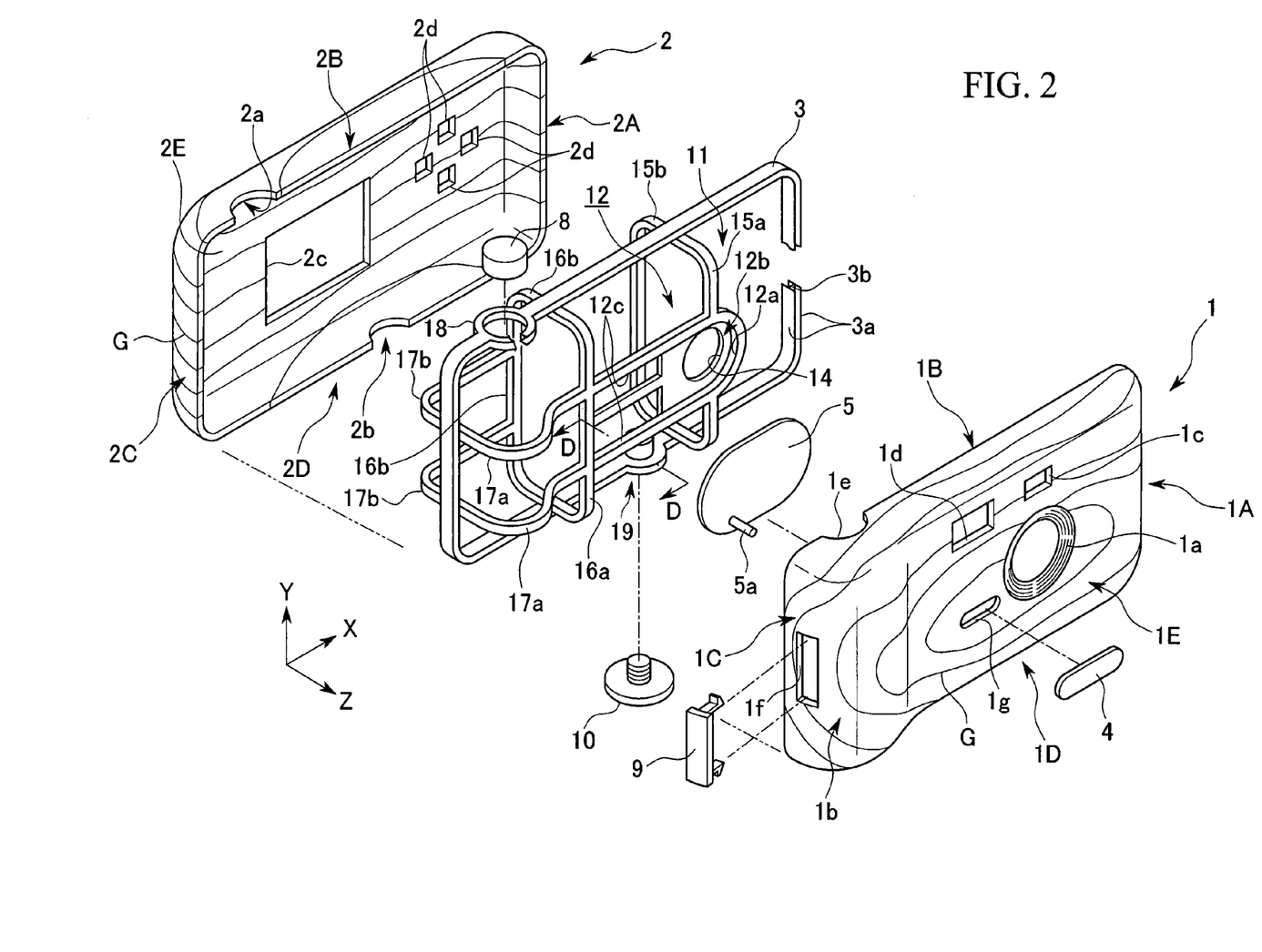
FIG. 2 is an exploded perspective view of a digital camera shown in FIG. 1 in order to illustrate a structure of a covering system thereof.
Figure 3:
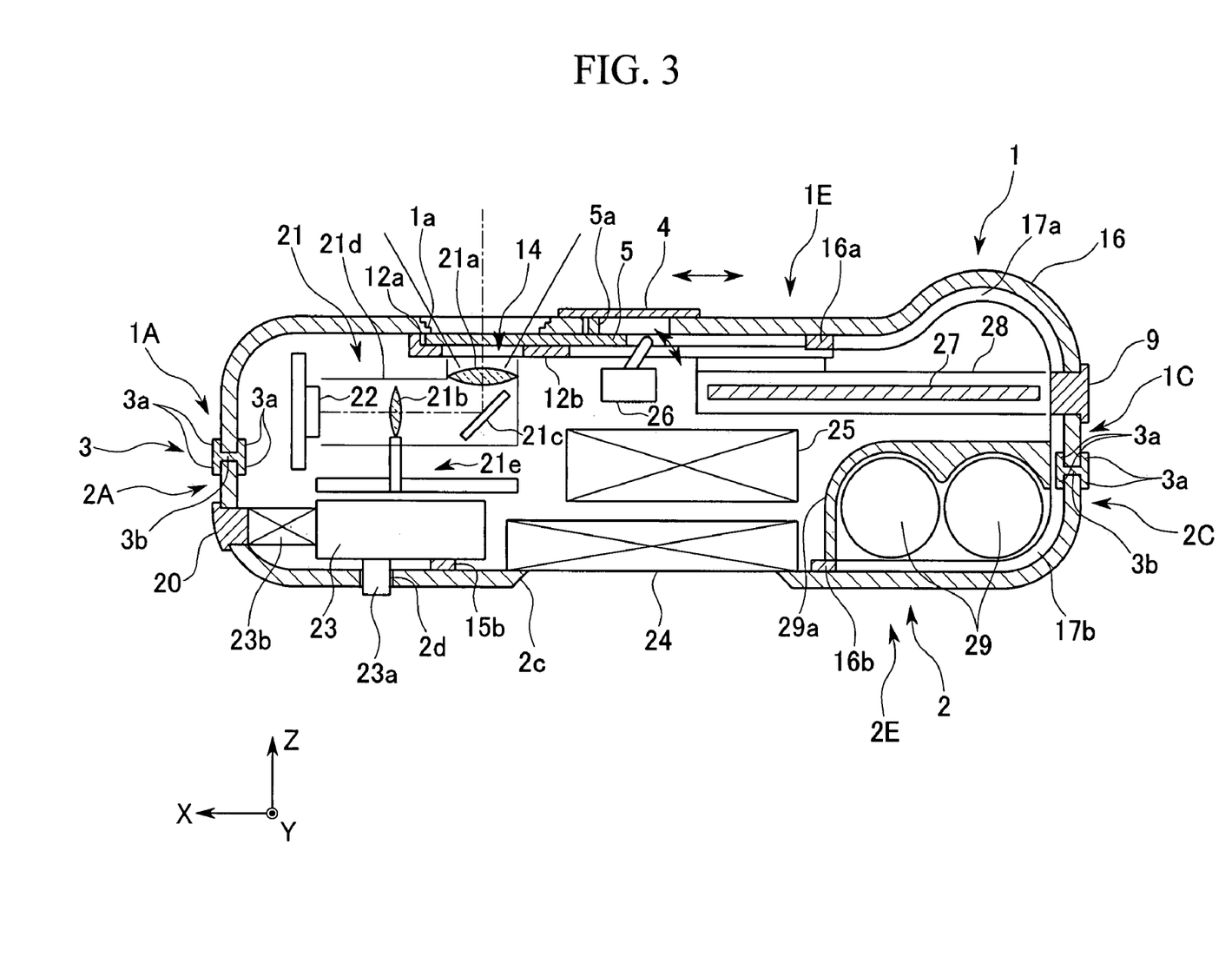
FIG. 3 is a sectional view taken along A-A of FIG. 1.
Figure 4:
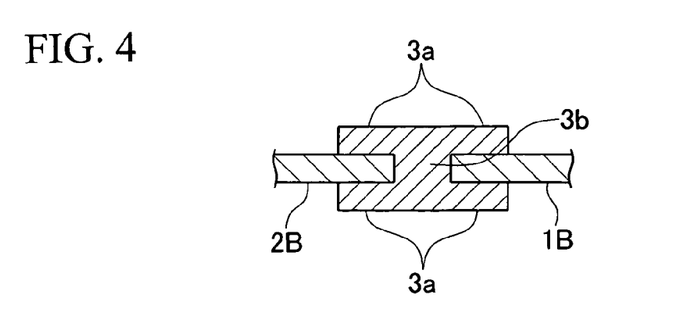
FIG. 4 is a sectional view taken along B-B of FIG. 1.

FIG. 1 is a perspective view of a digital camera that uses the case structure according to an embodiment of the invention. FIG. 2 is an exploded perspective view of a digital camera shown in FIG. 1 in order to illustrate a structure of a covering system thereof. FIG. 3 is a sectional view taken along A-A of FIG. 1. FIG. 4 is a sectional view taken along B-B of FIG. 1.

An X, Y, and Z rectangular coordinate system is described that is common to FIGS. 1 to 3. Under the coordinate system, when taking a position to take a photograph of an object in front holding a right side of a digital camera, a direction to the front is designated as a Z direction, a direction to the left as an X direction, and an upper vertical direction as a Y direction. For simplicity, relative directions may be explained hereunder referring to the coordinate system.

A case structure of an embodiment in accordance with the invention can be appropriately used, for example, in a digital camera 100 (an electronic device) shown in FIG. 1.

A casing of the digital camera 100, as shown in FIGS. 1 and 2, is made up of a front cover 1 (a covering member), a rear cover 2 (a covering member), a supporting frame 11 (supporting member), and a frame 3 (securing member).

The casing contains, as the covered parts, the well-known optical parts, mechanical parts, and electrical parts that are necessary for a digital camera. In this embodiment, as shown in FIGS. 1 and 3, are provided a built-in flash 6, a finder 7, an imaging unit 21, a liquid crystal display 24, an electrical control unit 23, a circuit unit 25, a memory card 27, batteries 29, and a barrier switch 26. One portion of the covered parts is exposed outside of an aperture provided on each of the front cover 1 and the rear cover 2.

The imaging unit 21, as shown in FIG. 3, is composed of a group of lenses 21a, a mirror 21c, and a group of lenses 21b which constitute a zoom lens optical system held at a lens barrel 21d, and a CCD as an image pick-up device, arranged at an image surface thereof.

The group of lenses 21a is a fixed group located nearest to an object.

The group of lenses 21b, at least a portion of which is set on an optical path folded by the mirror 21c, is a moving group movably held by a zooming mechanism 21e.

This structure enables the imaging unit 21 to perform a zooming without protruding from the casing.

A lens barrier 5 is used to cover the front of the group of lenses 21a when no photograph is taken. The lens barrier 5 is a plate in a shape of an ellipse or oval having a size that allows an imaging aperture 1a to be closed, and is made up of, for example, synthetic resin or metal.

When the lens barrier 5 is assembled, the minor axis of an ellipse or oval is guided to a lens barrier guide 12c (described later). On the lens barrier 5, a pin 5a is erected in a positive Z direction. The pin 5a, when assembled, is inserted into a slide hole 1g to be connected to a slide lever 4.

Thus, the movement of the lens barrier 5 can be realized by the movement of the slide lever 4 outside of the casing.

The barrier switch 26 is used to switch on or off the power of the digital camera 100 based on the movement of the lens barrier 5. As shown in FIG. 3, a switch lever 26a protrudes movably into a movement path of the lens barrier 5. When the lens barrier 5 covers the imaging aperture 1a, an electronic circuit is open. On the other hand, when the lens barrier 5 uncovers the imaging aperture 1a, the electronic circuit is closed.

The rear cover 2, as shown in FIG. 2, is of a box shape having an almost uniform thickness open to the positive Z direction that has a rectangular bottom plate 2E parallel to the XY plane, the circumference of which is enclosed by four sides.

At the top of each of the four sides are formed a left side end 2A and a right side end 2C in the positive and negative directions of the X axis, respectively, and an upper side end 2B and a lower side end 2D in the positive and negative directions of the Y axis, respectively. The end surface for each of these side ends is nearly aligned on a plane parallel to the XY plane.

In the upper side end 2B near the right side end 2C is provided a notch 2a that is cut out in the shape of a semicircle from the end surface of the upper side end 2B. In the middle of the lower side end 2D, a notch 2b is provided that is cut out in the shape of a semicircle from the end surface of the lower side end 2D.

In the nearly middle of the bottom plate 2E, the display aperture 2c is provided so that the liquid crystal display unit 24 can be seen from outside of the casing. In the left neighborhood (in the positive X axis direction) of the display aperture 2c, operation apertures 2d are provided to protrude the operation button 23a to the outside.

The rear cover 2 can employ wooden material, light metal (aluminum, stainless steel, titanium, magnesium, or the like) that allows press molding, or synthetic resin (ABS, polycarbonate, acrylic, or the like) that allows injection molding. In the embodiments wooden material is used that is excellent in hygroscopicity and superior in design making the most of natural features.

The wooden material used in the embodiments is compressed wooden material of which the density is enhanced and the strength is improved by compression molding.

Compression molding is performed as follows. Natural wood is cut relatively thick with regard to the thickness of the rear cover 2 to manufacture a prototype. The prototype is compression molded by dies in an atmosphere of high temperature water vapor to transfer the shape of the die surface. In this way, a thin shell type of member can be obtained, the surface of exposed woodgrain lines G, and the inside of which is much stronger than the prototype wooden material.

The notches 2a and 2b, the display aperture 2c, and the operation aperture 2d can be formed by, for example, secondary processing after compression molding.

In the embodiments, since the prototype for the rear cover 2 is cut out of an edge grain material, the cross section of a wood fiber is exposed at the end surfaces of the left side end 2A and the right side end 2C. Because cohesive force between the wood fibers is weak, the left side end 2A and the right side end 2C are easily broken or come off.

The surface of the rear cover 2 may be provided with a carbonizing layer or coating layer, or with a pattern, an unevenness, or the like, by secondary processing. Foreign materials such as synthetic resin and synthetic rubber, and metal can be embedded into or attached to the rear cover 2.

As a wooden material, the following can be selected: Japanese cypress, paulownia, teak, mahogany, Japanese cedar, pine, cherry tree, bamboo, or equivalents thereof. Not only raw wood but also a woody material such as a compression formed material that is made up of collected and solidified waste chips and sawdust can be used.

The front cover 1 is a formed article made of the similar compressed wooden material as the rear cover 2. The front cover 1, as shown in FIG. 2, is of a box shape having an almost uniform thickness open to the negative Z direction that has a rectangular bottom plate 1E parallel to the XY plane, the circumference of which is enclosed by four sides. Furthermore, in order to improve design, the front cover 1 uses a prototype cut out of a flat grain material so that complicatedly curved woodgrain lines G can be obtained. In this situation, as is the same with the rear cover 2, variation in strength of the ends occurs, depending on the way in which the woodgrain is overlapped at the ends.

At the top of each of the four sides are formed a left side end 1A and a right side end 1C in the positive and negative directions of the X axis, respectively, and an upper side end 1B and a lower side end 1D in the positive and negative directions of the Y axis, respectively. The end surface for each of these side ends is nearly aligned on a plane parallel to the XY plane.

In the upper side end 1B near the right side end 1C is provided a notch 1e that is cut out in the shape of a semicircle from the end surface of the upper side end 1B.

The notch 1e forms a round hole together with the notch 2a of the rear cover 2, and the notch 1h forms a round hole together with the notch 2b of the rear cover 2 when assembled.

Near the end surface of the right side end 1C, a insertion hole 1f for inserting and removing the memory card 27 is provided along the end surface thereof. A hole cover 9 can be removably mounted to the insertion hole 1f.

Near the right side end 1C of the bottom plate 1E, a grip 1b is formed that is swollen in a semicircle in the positive Z axis direction.

At the bottom plate 1E, the imaging aperture 1a to receive incident light is provided for a lens aperture of the imaging unit 21. The imaging aperture 1a, as shown in FIG. 3, has a slope to reduce its radius stepwise in the plate thickness direction of which the surface is carbonized to prevent stray light.

For the finder 7 and the built-in flash 6, a finder aperture 1c and a flash aperture 1d are provided to insert their top end, respectively.

Between the imaging aperture 1*a* and the grip 1*b*, a slide hole 1*g* is provided extending in the X axis direction. Into the slide hole 1*g*, a pin 5*a* of the lens barrier 5 placed inside of the front cover 1 can be inserted.

To the inner circumference of the frame 3 (a securing member) constituting a casing, a supporting frame 11 (a supporting member) is fixed. When the casing is assembled, the supporting frame 11 touches the inner surface of the front cover 1 and the rear cover 2, or is placed in a position adjacent to them. When an external force is applied to the front cover 1 and the rear cover 2, the supporting frame 11 is a reinforcing member for curbing their distortion to the inner side and preventing damage. When placed adjacent, an appropriate space is provided considering the amount of allowable deformation according to the strength of the front cover 1 and the rear cover 2.

A way of fixing the supporting frame 11 may be a suitable way such as welding, caulking, or thread fastening. Alternatively, the supporting frame 11 may be formed integrally with the frame 3.

The supporting frame 11 contains front frames 15*a*, 16*a*, and 17*a*, rear frames 15*b*, 16*b*, and 17*b*, and a lens barrier storing portion 12, and is mainly composed of a frame structure of rod members having a cross section of a square.

The front frames 15*a* and 16*a* and the rear frames 15*b* and 16*b* are spaced with an interval in the middle of the longer direction of the frame 3, and are made up of a U-shaped member along a curvature of the inner surfaces of the front cover 1 and the rear cover 2 built between the span of the shorter direction of the frame 3. The front frame 15*a* is placed in a position corresponding to the left side (the positive X axis direction) of the imaging aperture 1*a*, while the front frame 16*a* is arranged in a middle position between the grip 1*b* and the imaging aperture 1*a*.

The front frame 17*a* and the rear frame 17*b* are placed with an interval in the middle of the shorter direction of the frame 3 to be built between the front frame 16*a*, the rear frame 16*b*, and frame 3, respectively. The front frame 17*a* and the rear frame 17*b* consist of an L-shaped member curved to be along the inner surface of the bottoms 1E and 2E. The front frame 17*a* contains a curvature for the grip 1*b*, in which an L-shaped bent portion projects circularly.

A lens barrier storing portion 12 accommodates the lens barrier 5 together with the front cover 1 to movably hold the lens barrier 5 to the X axis direction. The lens barrier storing portion 12 includes a lens barrier guide surface 12*b* provided at a position slightly lower than the front surface of the front frame 15*a* and 16*a* (the surface opposite to the bottom plate 1E) by a thickness of the lens barrier 5, a lens barrier stopper 12*a* having a curvature to stop the end of the major axis of the lens barrier 5 from the middle of the front frame 15*a*, and lens barrier guides 12*c* and 12*c* having a slightly wider interval than a minor axis width of the lens barrier in the Y axis direction between the front frame 15*a* and the front frame 16*a*. The front surface of the lens barrier guide 12*c* is aligned with the front frames 15*a* and 16*a*.

The lens barrier guide surface 12*b* has an aperture 14 in a position corresponding to the lens aperture of the imaging unit 21.

Subsequently, the operation of the supporting frame 11 of the embodiment will be explained.

Figure 6:
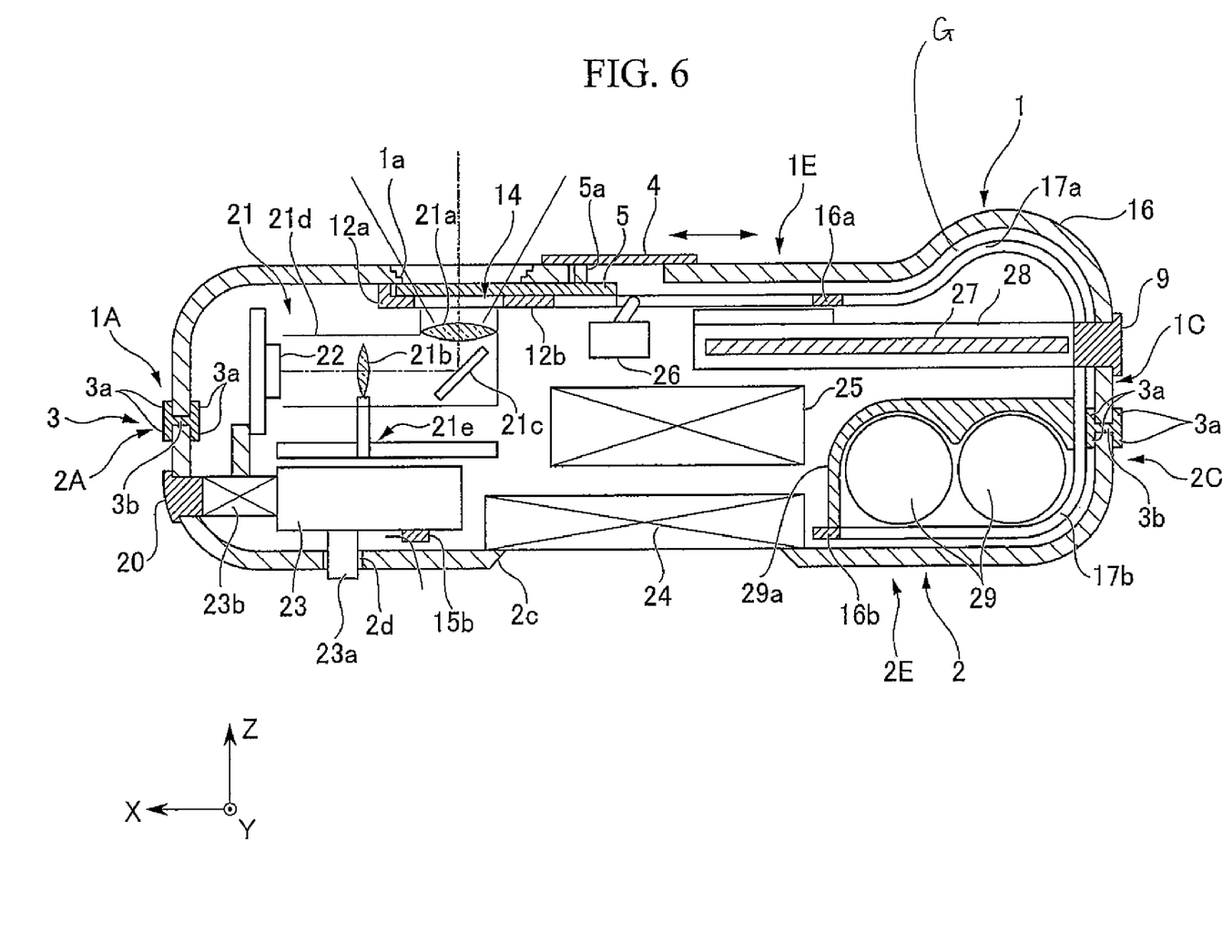
FIG. 6 is a sectional view taken along A-A of FIG. 1.

When an external force is applied to the front cover 1 and the rear cover 2, the supporting frame 11 can restrain their deformation at positions where the supporting frame 11 directly contacts them. Therefore, it is possible to ensure that stress caused by the external force does not exceed the breaking strengths of the front cover 1 and the rear cover 2 by providing appropriate gaps G between them and the supporting frame 11 (FIG. 6).

Moreover, as with the front frame 15*a* and the rear frame 15*b*, and the front frame 16*a* and the rear frame 16*b*, the structure circularly continuous to each other can resist an external force, which constitutes an advantage.

Since the supporting frame 11 has a frame structure, the covered parts can be arranged near the inner surfaces of the covering member in the space surrounded by the frames, achieving a space-saving constitution and enabling to downsize.

Alternatively, the space surrounded by the frames can be utilized to guide or store the member like the lens barrier 5 that is arranged in close contact with the covering member.

A frame structure is advantageous in facilitating formation of a curved shape along the inner surfaces of the covering members.

As a material for the supporting frame 11, wood, synthetic resin, or metal stronger than the front cover 1 and the rear cover 2 can be employed.

The frame is roughly so formed, as shown in FIG. 4, that a rod material whose cross section is of an H shape, where a web 3*b* (an end holding portion) is provided with side guides 3*a* (a side guide portion) as a flange, is bent according to a nearly rectangular aperture that each end of the front cover 1 and the rear cover 2 makes up to form a circular frame body (see FIG. 2). In order to show the cross section, FIG. 2 is partially broken.

The web 3*b* and the side guides 3*a* and 3*a* constitute a U-shaped groove that holds the ends of the front cover 1 and the rear cover 2, respectively. When the front cover 1 and the rear cover 2 are pushed in between the side guides 3*a* and 3*a* from the Z axis direction to be assembled, at least one portion of each of the end surfaces of the web 3*b* can strike against the front cover 1 and the rear cover 2, so that the location of the front cover 1 and the rear cover 2 in the direction which they are pushed in can be controlled.

Since the digital camera 100 should be repaired by opening the casing when in trouble, the front cover 1 and the rear cover 2 are removably fixed to the frame 3. Although not shown in FIG. 2, for the drawings to be viewed easily, a fixing means is provided at appropriate positions in the frame 3.

Various types of fixing means may be used; for example, the structure is employed that is composed of a projected piece which projects by at least the length enabling to fasten by screws from the side guide 3*a* of the inner side of the casing against the opposite side guide 3*a*, and has an appropriate width; and a female screw formed thereon to fasten the front cover 1 or the rear cover 2.

In this case, the front cover 1 or the rear cover 2 is provided with a through hole to pass the screw.

In this way, with respect to the covering member, only the through hole has to be processed, and no tapping may be made. Consequently, materials with low strength such as a wooden material can be fixed and removed repeatedly, and constitute a casing excellent in durability.

As a material for the frame 3, synthetic resin or metal stronger than the front cover 1 and the rear cover 2 can be employed.

The supporting frame 11, integrally fixed with the frame 3, may disperse an external force applied through the front cover 1 and the rear cover 2 and may transfer the stress to the frame 3.

Being built in the frame 3, the supporting frame 11 is also a beam member for loading an external force from the circumferential direction of the frame 3.

A various kinds of objects built in the casing can be touched with or fixed at the frame 3 and the supporting frame 11. For example, as shown in FIG. 3, the electrical control unit 23 is attached to the rear frame 15b. A battery case 29a is mounted to the rear frame 16b and the frame 3. A card holder 28 is mounted to the front frame 16a and the front frame 17a. Likewise, the members whose attachment partners are not shown in FIG. 3 are fixed at holding members (not shown) that are attached to the frame 3 and the supporting frame 11.

Modifications of the supporting member of the embodiment will be explained.

Figure 5A:
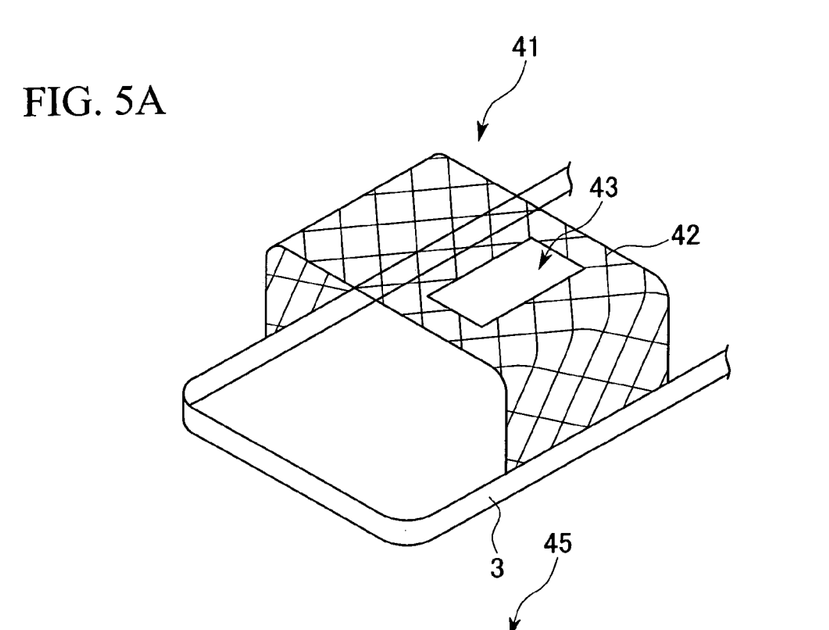
FIGS. 5A and 5B are perspective views which schematically explain a first and a second modification of the supporting member according to an embodiment of this invention, respectively.
Figure 5B:
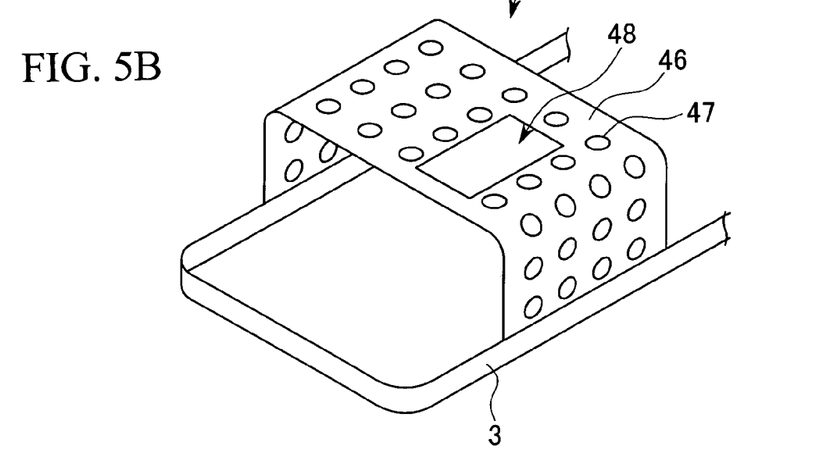

FIGS. 5A and 5B are perspective views which schematically explain a first and a second modifications of the supporting member according to an embodiment of this invention, respectively.

As shown in FIG. 5A, a supporting frame 41 (supporting member) according to the first modification of the embodiment is built between opposing frames of the frame 3 along the inner surface of the covering member. For simplicity, the supporting frame 41 is illustrated to be of box-shape having U-shape in cross-section in FIG. 5A, but any three-dimensional shape is acceptable.

The supporting frame 41 has a net-like frame structure that comprises, for example, a mesh 42 having multiple rectangular openings.

The mesh 42 can be provided with an opening 43 where necessary. The outer periphery of the mesh 42 and the inner periphery of the opening 43 may be connected to a frame made of the material different from that of the mesh 42.

Although not illustrated in FIGS. 5A and 5B, the covering member and covered parts may be directly contacted with, or secured to, the mesh 42 if necessary.

When the mesh 42 is made of metal, it may be formed by twining or joining metal wires. When the mesh 42 is made of synthetic resin, it can be molded into various mesh shapes.

Preferably, when using metal for the mesh 42, it should be treated by a thermosetting process, such as quenching, after being formed into the appropriate shape. This causes the mesh to be of high strength even when the diameter of the metal wires is reduced.

According to the supporting frame 41 described above, the netty frame structure enables a complex three-dimensional curved face to be formed easily. By providing the opening 43 only where it is needed, a comparatively wide area of the inner surface of the covering member can be covered by the supporting frame 41, enabling an external force applied to the covering member to be dispersed over a wide area.

As shown in FIG. 5B, the supporting frame 45 (supporting member) according to the second modification of the embodiment is built on the frame 3 in the same way as the supporting frame 41, and has a plate-shell structure wherein a multiple holes 47 are formed in a plate portion 46 instead of the mesh 42. An opening 48 that is larger than the holes 47 may be provided if necessary.

A press-processed punching metal or a molded synthetic resin can be used as the material for the supporting frame 45.

The plate-shell structure of the supporting frame 45 enables a complex three-dimensional shape to be formed easily. By providing the opening 48 only where it is needed, a comparatively wide area of the inner surface of the covering member can be covered by the supporting frame 41, enabling an external force applied to the covering member to be dispersed over a wide area. Since a wide area is covered, the plate can be made thin to form a space-saving supporting member.

In the first and second modifications, when the mesh 42 and the plate portion 46 are made of metal, a wide area of the inner surfaces of the covering member is covered at an appropriate area density, enabling them to be used as electromagnetic shield members. This is advantageous in easily facilitating countermeasures against electromagnetic radiation of the electronic device, even when the covering member is formed of a nonconductive material such as wood.

While the above explanation describes an example where the members held by the supporting member are mainly covered parts, the supporting member can be arranged to hold external members that are exposed outside the casing, by providing through holes in the covering member and the like.

For example, while an external member such as the hole cover 9 is attached to the insertion hole 1f in the front cover 1 in the above explanation, the supporting frame 11 can be arranged so as to hold the hole cover 9 by extending the shape of the supporting frame 11 into the insertion hole 1f.

While the embodiment describes the lens barrier 5 that can move between the covering member and the supporting member, a barrier may be provided as an external member that moves along the outside of the front cover 1, a guide for moving the barrier being provided in the supporting frame 11.

While the slide lever 4, being an external member, moves along the slide hole 1g, the slide hole 1g may instead be treated simply as an opening, with a guide portion that corresponds to the slide hole 1g being provided in the supporting frame 11.

When external members are held by the supporting member in this way, the load on the covering member is reduced and its durability is improved.

While the above explanation describes an example where the frame-like securing member is provided to secure the ends of the covering member, such a securing member may be omitted from the structure. In this arrangement, the case can be formed by securing the ends of covering member together directly. If the supporting member is strong enough, the covering member may be secured to it.

In the above explanation, while the frame 3 is H-shaped in cross-section, and is a member to which the ends of the front cover 1 and the rear cover 2 are secured by striking the web 3b, the arrangement is not limited to this; for example, the cross-sectional shape of the frame 3 may be modified as appropriate, e.g. T-shaped, h-shaped, or the like.

The above explanation is made of assuming that the frame 3 is a circular frame body. As long as the frame has a structure that hold the supporting member and bear the stress, the frame 3 may be formed while divided in the circumferential direction of the top end of the covering member if necessary. For example, the constitution may be employed where beam members that are different from the supporting member are joined between a plurality of above frames 3.

In the case, at positions at which the frame 3 is not placed, a suitable member shades light and blocks dust, depending on the situation.

The above explanation is given to an example in which a case structure for an electronic device in accordance with the invention can be applied to a digital camera as an electronic device. The invention is preferable for all the electronic devices such as a remote controller for a television set, a video recorder, an air conditioner, or a projector, a portable telephone, an IC recorder, and a PDA. In particular, the invention is most preferable for hand-held and hand-operated electronic devices to which using a wooden material as a covering member provides good hygroscopicity and good sensation.

According to the case structure for electronic device of the invention, deformation of the covering member can be restrained by providing a supporting member along inner surfaces thereof, making it possible to form a casing that is unlikely to be damaged while using a wood of comparatively low strength for the covering member.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The case structure for the electronic device in accordance with the invention can be applied to a casing of an electronic device. The case structure for the electronic device enables the covering members made of wood material to form the casing unlikely to be damaged.

What is claimed is:

1. A case structure for an electronic device, comprising:
   at least two covering members made of a wooden material for covering a covered part of the electronic device, the covering members being formed by compression molding into a box shape open to one direction; and
   a supporting member provided along inner surfaces of the covering members for supporting the covering members;
   wherein the supporting member includes a rod member in a frame structure.

2. The case structure for an electronic device as recited in claim 1, wherein the supporting member is also a holding member for holding the covered part.

3. The case structure for an electronic device as recited in claim 1, wherein the supporting member is also a holding member for holding an external member provided outside the covering member.

4. The case structure for an electronic device as recited in claim 1, wherein a gap is provided between the supporting member and the inner surface of each covering member.

5. The case structure for an electronic device as recited in claim 1, further comprising:
   a frame-shaped securing member interposed between the two covering members and being separate from the covering members.

6. The case structure for an electronic device as recited in claim 5, wherein the securing member is formed integrally with the supporting member so as to secure the end portion of the covering member.

7. The case structure for an electronic device as recited in claim 5, wherein the supporting member is built between the opposing portions of the securing member.

8. The case structure for an electronic device as recited in claim 5, wherein the securing member includes an end holding portion for striking against the ends of the covering members and a side guide portion formed by bending along the end portion of the covering member.

* * * * *